US010204182B2

United States Patent
Parthasarathy et al.

(10) Patent No.: US 10,204,182 B2
(45) Date of Patent: Feb. 12, 2019

(54) SYSTEM FOR OBTAINING AND CLASSIFYING ENERGY CHARACTERISTICS

(71) Applicant: Ademco Inc., Golden Valley, MN (US)

(72) Inventors: Girija Parthasarathy, Maple Grove, MN (US); Wendy Foslien, Woodbury, MN (US); Pedro Davalos, Plymouth, MN (US)

(73) Assignee: Ademco, Inc., Golden Valley, MN (US)

( * ) Notice: Subject to any disclaimer, the term of this patent is extended or adjusted under 35 U.S.C. 154(b) by 1015 days.

(21) Appl. No.: 14/231,474

(22) Filed: Mar. 31, 2014

(65) Prior Publication Data

US 2014/0297238 A1   Oct. 2, 2014

Related U.S. Application Data

(60) Provisional application No. 61/807,184, filed on Apr. 1, 2013.

(51) Int. Cl.
*G06F 17/50* (2006.01)
*G06F 7/60* (2006.01)
*G06G 7/56* (2006.01)

(52) U.S. Cl.
CPC ............... *G06F 17/5004* (2013.01)

(58) Field of Classification Search
CPC .................................. G06F 17/5004
USPC ............................... 703/1, 2, 5
See application file for complete search history.

(56) References Cited

U.S. PATENT DOCUMENTS

| 4,897,798 A * | 1/1990 | Cler ................ F24F 11/0009 165/239 |
| 5,115,967 A * | 5/1992 | Wedekind ............ F24F 11/00 165/239 |
| 6,098,893 A | 8/2000 | Berglund et al. |
| 7,188,779 B2 * | 3/2007 | Alles .................. F24F 3/0442 165/205 |
| 8,188,872 B2 * | 5/2012 | Fischer ............... G08B 17/06 340/584 |
| 8,359,124 B2 * | 1/2013 | Zhou ................ G05B 13/024 700/276 |
| 8,521,708 B2 * | 8/2013 | Ahmed ............... G06Q 10/10 707/705 |
| 8,606,374 B2 | 12/2013 | Fadell et al. |
| 9,159,108 B2 * | 10/2015 | Steven ................ G06Q 10/06 |
| 2005/0192680 A1 * | 9/2005 | Cascia ............... G05B 13/027 700/29 |
| 2005/0194455 A1 | 9/2005 | Alles |
| 2009/0005912 A1 | 1/2009 | Srivastava et al. |
| 2011/0106328 A1 | 5/2011 | Zhou et al. |

(Continued)

OTHER PUBLICATIONS

Time series, Wikipedia, printed Aug. 31, 2017, pp. 1-18.*

(Continued)

*Primary Examiner* — Juan C Ochoa
(74) *Attorney, Agent, or Firm* — Shumaker & Sieffert, P.A.

(57) ABSTRACT

An approach and system for receiving data from a thermostat in a building, treating the data as representative of a thermal response model or system, and determining a relationship between a rate of building internal temperature change and change in outdoor temperature to provide an indication of how well a building is insulated versus a thermal mass of the building.

18 Claims, 23 Drawing Sheets

(56) References Cited

U.S. PATENT DOCUMENTS

| | | | | |
|---|---|---|---|---|
| 2011/0123179 A1* | 5/2011 | Roetker | ............. | F24D 17/0031 |
| | | | | 392/441 |
| 2011/0231320 A1* | 9/2011 | Irving | .................... | G06Q 30/00 |
| | | | | 705/80 |
| 2012/0296490 A1* | 11/2012 | Fausak | ................... | G01D 4/002 |
| | | | | 700/297 |
| 2013/0214598 A1* | 8/2013 | Burke | ................... | G05B 15/02 |
| | | | | 307/31 |
| 2013/0221117 A1* | 8/2013 | Warren | ................. | G05D 23/19 |
| | | | | 236/1 C |

OTHER PUBLICATIONS

Katipamula et al., Small- and Medium-Sized Commercial Building Monitoring and Controls Needs: A Scoping Study, Oct. 2012, U.S. Department of Energy, PNNL-22169, 164 pages.*

* cited by examiner $$m \cdot c_p \frac{dT}{dt} = \dot{Q}_{furnace} - \dot{Q}_{heatloss}$$

$$m \cdot c_p \frac{dT}{dt} = \dot{Q}_{furnace} - UA(T - T_{OA})$$

$$\frac{dT}{dt} = \frac{\dot{Q}_{furnace}}{m \cdot c_p} - \frac{UA}{m \cdot c_p}(T - T_{OA}(t))$$

$$\frac{m c_p}{UA} = \frac{T_{OA} - T}{(dT/dt)}$$

FIG. 12

SYSTEM FOR OBTAINING AND CLASSIFYING ENERGY CHARACTERISTICS

This application claims the benefit of U.S. Provisional Application Ser. No. 61/807,184, filed Apr. 1, 2013, and entitled "Classification of Building Energy Characteristics Based on Connected Thermostat Data". U.S. Provisional Application Ser. No. 61/807,184, filed Apr. 1, 2013, is hereby incorporated by reference.

BACKGROUND

The present disclosure pertains to energy usage and particularly to time constants in buildings.

SUMMARY

The disclosure reveals an approach and system for receiving data from a thermostat in a building, treating the data as representative of a lumped capacity model or system, and determining a relationship between a rate of building internal temperature change and change in outdoor temperature to provide an indication of how well a building is insulated versus a thermal mass of the building, which may lead to a thermal time constant of the building.

BRIEF DESCRIPTION OF THE DRAWING

FIG. 12 is a diagram of equations that may be used in a thermal response analysis for a heating season and an example or instance of that analysis may assume a lumped capacity model or system;

DESCRIPTION

Figure 1:
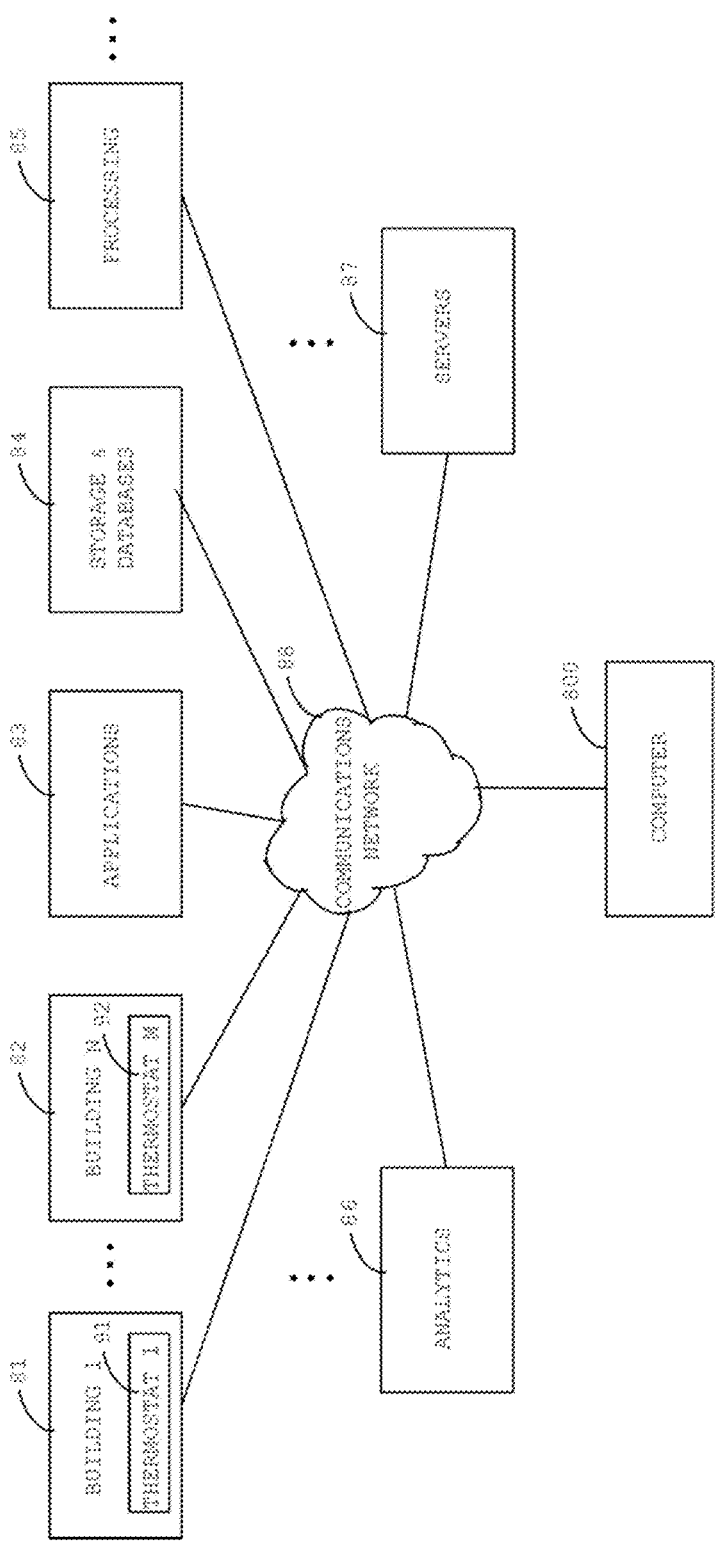
FIG. 1 is a diagram of an illustrative example setup for effecting the present system and process.

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

Algorithms or functions may be implemented in software or a combination of software and human implemented procedures in an example. The software may consist of computer executable instructions stored on computer readable media such as memory or other type of storage devices. Further, such functions may correspond to modules, which are software, hardware, firmware or any combination thereof. Multiple functions may be performed in one or more modules as desired. The software may be executed on a digital signal processor, ASIC, microprocessor, or other type of processor operating on a computer system, such as a personal computer, server or other computer system.

Networked thermostats or connected thermostats may be capable of providing data regarding temperatures and setpoints corresponding to the buildings whose temperatures they regulate. Together with other information, such data may be used to create models of buildings regarding energy utilization.

Connected thermostats may generate large amounts of data. Analytics on this data may provide very useful insights as a forecast of demand response potential, operational setpoint recommendations for savings, energy efficiency upgrade recommendations, diagnosis of equipment issues, and so forth.

Connected thermostats may produce a limited amount of time-series data such as indoor temperature ( ) and humidity, temperature setpoints, outdoor temperature and humidity, and heating or cooling mode. The data may be recorded asynchronously, such as when change occurs). In order to extract values from the time series data, a simple lumped capacity model of the building or house may be created. Some parameters related to thermal capacity and energy efficiency of the building may be extracted for classifying the buildings as groups with respect to the parameters and external weather conditions.

By likening the building to, for example, a lumped capacity model or system (functioning as one unit for thermal modeling consideration), various parameters, such as specific heat capacity, mass, heat transfer coefficient, surface area and internal heating/cooling source information may be assigned to a building. An equation may represent the rate of change of indoor temperature with time, given an outdoor temperature and the noted parameters.

FIG. 12 is a diagram of equations that may be used in a thermal response analysis for a heating season. An example or instance of that analysis may assuming a lumped capacity model or system. Symbol 93 represents thermal mass. Symbol 94 represents heat capacity. Symbols 93 and 94 together represent thermal or heat capacity (also called thermal mass).

Symbol 95 represents the rate of heat or energy provided by a furnace into the building. Symbol 96 represents an amount of heat or energy that escapes form the building. Symbol 97 represents an overall heat transfer coefficient for the building. Symbol 98 represents the total surface area of the building. Symbols 97 and 98 represent the total heat transfer or loss from the building per degree of temperature. Symbol 99 represents the indoor temperature of the building. Symbol 101 represents the outdoor temperature of the building. Equation 102 represents a time constant of the building. Thus, when furnace heating or air conditioner cooling requests are zero (e.g., night setback), the relationship between the rate of room temperature change and delta T (T-Toa) may provide an indication of how well the building is insulated versus the thermal mass of the building.

Categories of building characteristics may include: poorly insulated and small thermal mass for a small time constant; well insulated and small thermal mass for a moderate time constant; poorly insulated and a large thermal mass for a moderate time constant; and well insulated and a large thermal mass for a large time constant.

Other classifications of building energy characteristics may incorporate a rate of temperature change at a particular weather condition for particular type of buildings at particular setbacks. By computing a rate of room temperature change and correlating it with a difference between outdoor and indoor temperatures, a time constant parameter may be estimated. Different buildings may be compared among one another and with themselves at different points in time.

Buildings may be classified according to their temperature rate of change during different outdoor weather conditions, which may work well for large data applications when small amounts of data from a large set of devices need to be processed.

Additional data (such as thermostat relay position, house or heating/cooling source specifications) and/or more frequent data may be used to create a building model for predicting energy usage.

An analytic capability may be built into a system that collects and processes thermostat data. As thermostat data from different regions become available, a computer may run the data through analytic software.

Results of an approach may incorporate a current estimate of building time constants, plots indicating comparisons among various buildings and changes from the previous updates, and other parameters that are derived from the process. The process may lead to automated anomaly detection, recommendations for operator action, or owner action for energy saving measures.

FIG. 1 is a diagram of an illustrative example setup for effecting the present system and process. A computer 800 may have a connection with thermostats (1) 91 through (M) 92 of buildings (1) 81 through (N) 82. M and N may represent a small number or large numbers. The buildings may be of different types (including residences) and be in various geographical locations. The connections of the thermostats to computer 800 may be direct or indirect, wireless or wire, or effected in other ways. For instance, computer 800 may be connected to the thermostats via a communications network 88 or cloud. Computer 800 may a mechanism for operating the present system. Computer 800 may have other connections with the buildings besides the thermostats. Computer 800 may connect with and utilize applications 83, storage and databases 84, processing 85, analytics 86, servers 87, and so forth, via the communications network 88, such as for example, the Internet. Computer 800 is further discussed relative to FIG. 19.

Figure 13A:
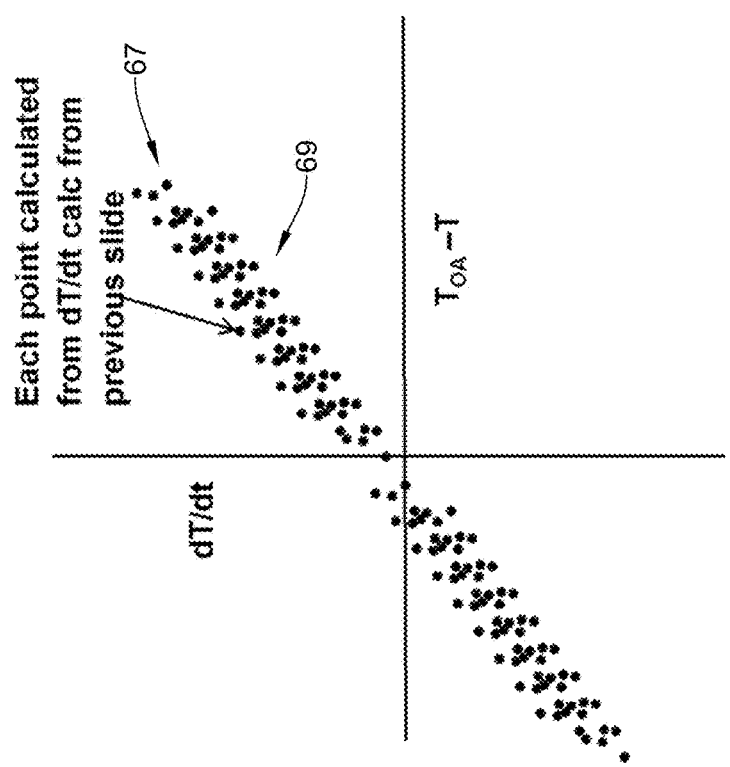
FIG. 13a is a graph of data plotted as |dT/dt| versus delta T from building data.
Figure 13B:
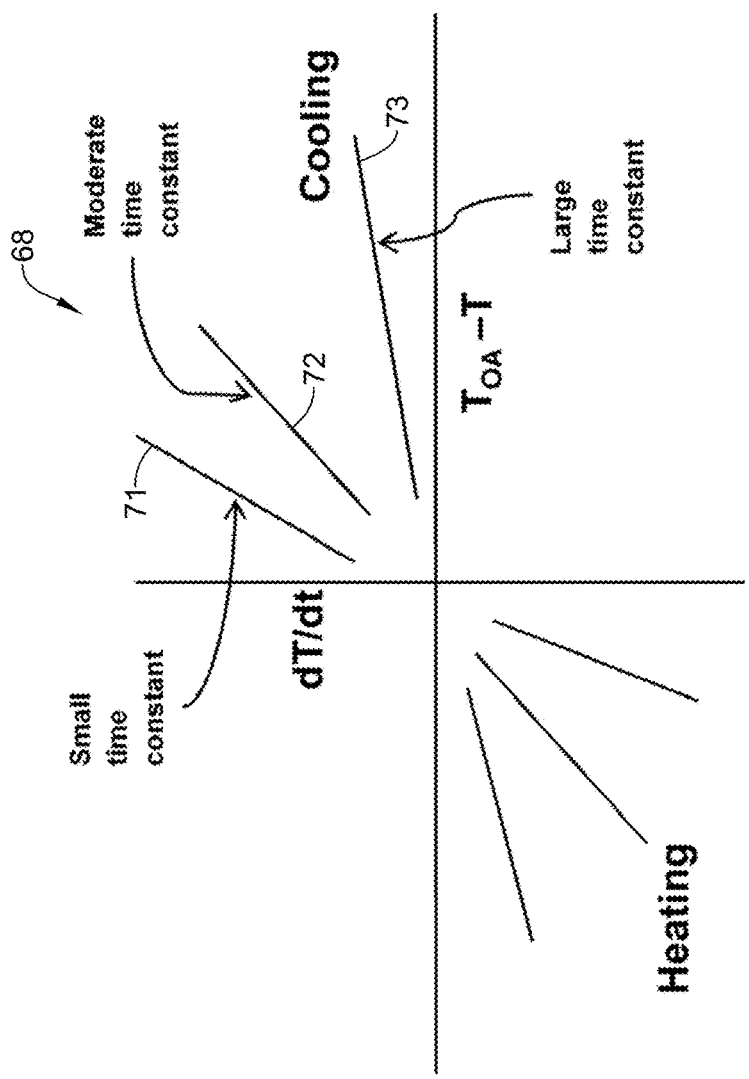
FIG. 13b is a graph of the data plotted as |dT/dt| versus delta T where patterns may emerge for different time constants.

FIG. 13a is a graph 67 of data plotted as |dT/dt| versus |Toa-T| (delta T) from building data. Each point may be calculated from a dT/dt from the formulas of FIG. 12. FIG. 13b is a graph 68 of the data plotted as |dT/dt| versus |Toa-T| where patterns 71, 72 and 73 of a small time constant, moderate time constant and large time constant, respectively, in the cooling situation may emerge for particular locations or different types of buildings. Patterns are also shown for the heating situation in the lower left of the graph. The patterns may be regarded as time constants, but not necessarily in terms of classical thermal time constants.

Patterns 71, 72 and 73 may be approximations since several parameters are not necessarily taken into account, such as for example solar gain, occupancy, adjacency to interior spaces, and so on. However, the approximations may be efficient and reliable for purposes of determining building energy characteristics. Additional information such as weather (e.g., solar gain) may be overlaid to better reveal a pattern for particular locations or types of buildings in terms of |dT/dt| versus |Toa-T| in graphs 67 and 68.

A procedure for determining building energy characteristics particularly with connected thermostats may be noted. Data may be collected for buildings, setpoint changes may be detected for cooling or heating, such as a setpoint change being a night setback (e.g., a heating mode with a setpoint decrease or a cooling mode with a setpoint increase). One may note if a setpoint change is accompanied by a rather long period of a constant setpoint before and after the change. A variance may be noted. One may get a slope of disp T change upon a duration (e.g., one-half hour) after a setpoint change. There may be a linear fit for a slope with enough data, or a simple slope calculation may be made. An outdoor temperature change may be obtained during the same period. A save may be made of dT/dt and (Toa-Tdisp) along with parameters, device ID, location and information at hand. The parameters may be analyzed. Data cleaning may be used to remove anomalous measurements. Other corrections may apply.

Heating and cooling data may be separated out since behavior of the occupants or the building may be different during two seasons. There may be further separation for different outside air temperature ranges by binning the slope dT/dt within bins of delta T (Toa-Tin).

There may be an improved line fit for a more accurate model. Line fitting through robust regression may be used for taking care of outliers, i.e., iterative weighting of data points. Line fitting through total least squares and principal components fit may be used to take care of asymmetry in a line fit. There may be statistical characterization of the time constant to characterize the variability in the time constant and to provide uncertainty quantification to applications that use this analysis. Variability may be quantified with confidence intervals. These items of further analysis may bring more accurate conclusions.

Figure 13C:
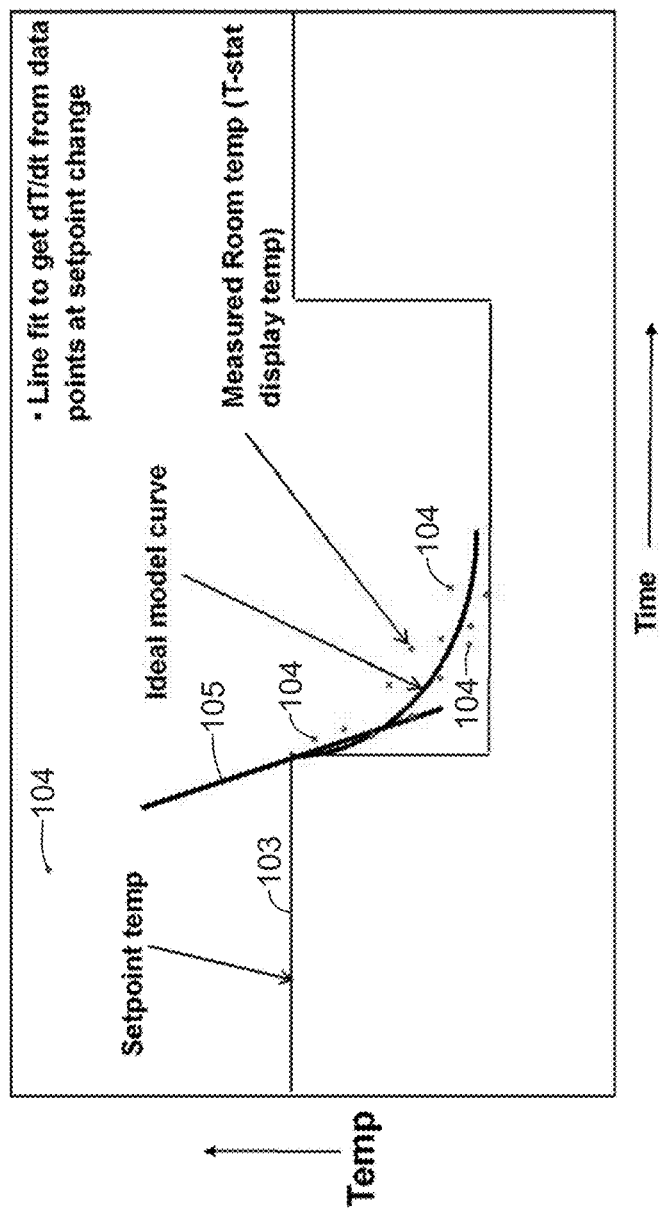
FIG. 13c is a diagram of setpoint temperature, temperature datapoints and a line from the data.

FIG. 13c is a diagram of setpoint temperature 103, temperature datapoints 104, and a line 105 fit to get dT/dt from datapoints 104 at setpoint temperature 103 change. Line 106 may be an ideal model curve.

Figure 13D:
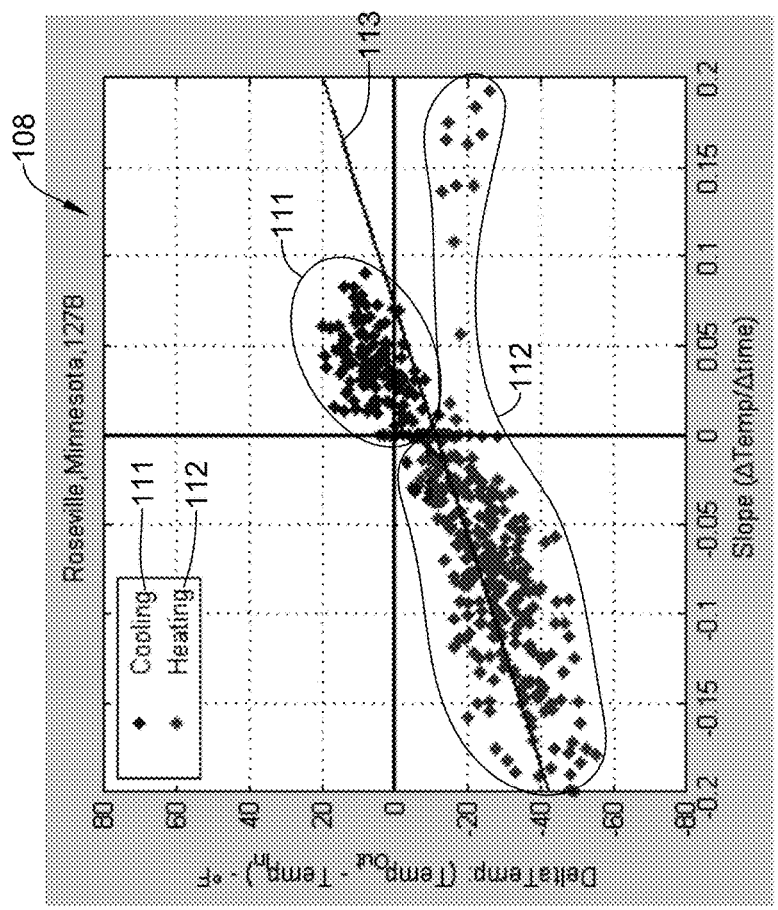
FIG. 13d and FIG. 13e are diagrams of graphs, respectively, that reveal a comparison after separating cooling and heating.
Figure 13E:
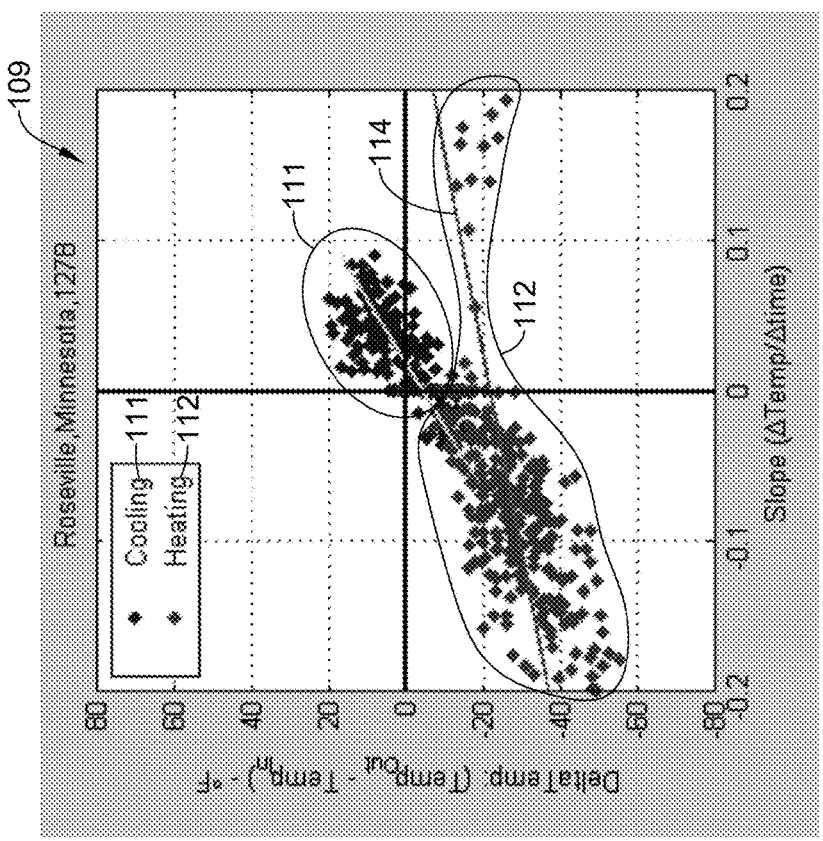

FIG. 13d and FIG. 13e are diagrams of graph 108 and graph 109, respectively, that reveal a comparison after separating cooling and heating. The graphs show delta temperature (Tout-Tin) versus slope (delta temp/delta time). Cooling data is shown approximately by an encircling line 111 and heating data is shown approximately by an encircling line 112. A time constant 113 may be revealed for the cooling situation in graph 108. A time constant 114 may be revealed for the heating situation in graph 109.

Demand response (DR) customization may be noted. Building performance may be predicted for given weather conditions with confidence bounds. One may customize a thermostat DR signal to known building characteristics. For a building with quick internal heat gain, a thermostat turndown level may need to be higher to get a guaranteed response; or one may keep thermostat turndown level lower to avoid comfort issues. For DR recruitment, one may select buildings based on performance characteristics As to energy efficiency, one may compare building to its past performance by noting whether the building is in its range for thermal loss. One may compare the building to others in the region to improve efficiency. As to building energy maintenance, the building performance trend may be watched by asking whether the building thermal loss is in the range of past behavior.

Significance relative to a virtual power plant may be noted. There may be a capability to control an aggregated group of loads virtual power plants. A use of thermostatically controlled loads (TCLs) may be considered for this purpose since they have built-in thermal capacitance. The virtual power plants may be an alternative to building new power plants, or keeping generators on to manage renewable variability. However, virtual power plants do not necessarily have the same controllability as traditional generators. There may be a need of accurate models of the behavior of aggregated loads and their response to DR signals. The thermostat data analysis noted herein may have a direct application into aggregating HVAC loads to develop a virtual power plant application.

FIGS. 2-11 and 14-18 are diagrams of graphs and bar charts that may illustrate various setpoints and temperatures for different devices at various locations, according to various examples, and can be regarded as exploratory and for illustrative purposes.

Figure 2:
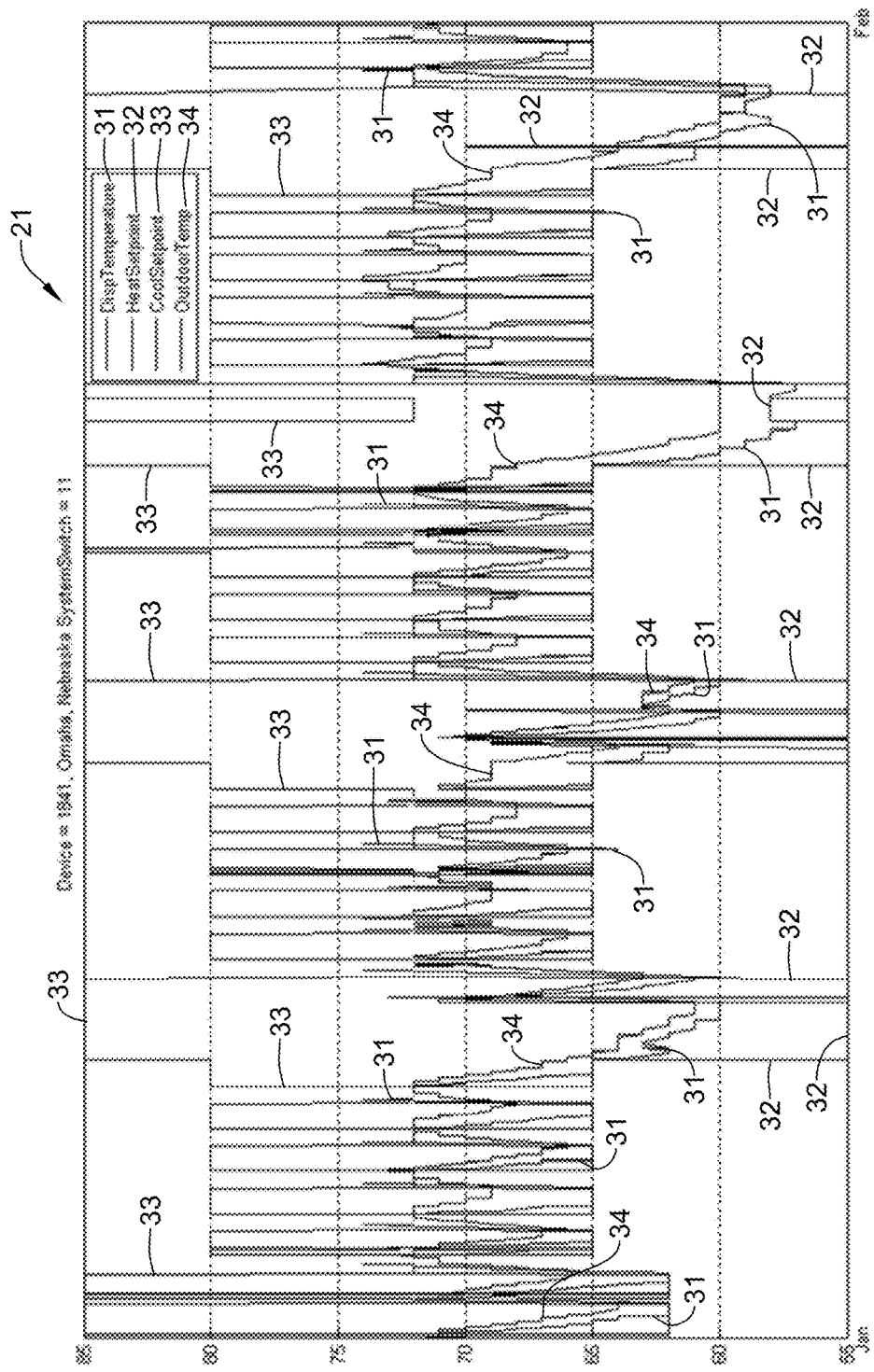
FIG. 2 is a diagram of a graph revealing setpoints and temperatures for a building in Omaha, Nebr., shown for a month of January.

FIG. 2 is a diagram of a graph 21 revealing setpoints and temperatures for a building in Omaha, Nebr. Disp (indoor) temperature 31, heat setpoint 32, cool setpoint 33 and outdoor temperature 34 are shown for a month of January. FIGS. 2-11 are diagrams with thermostatic data and may be for illustrative purposes.

Figure 3:
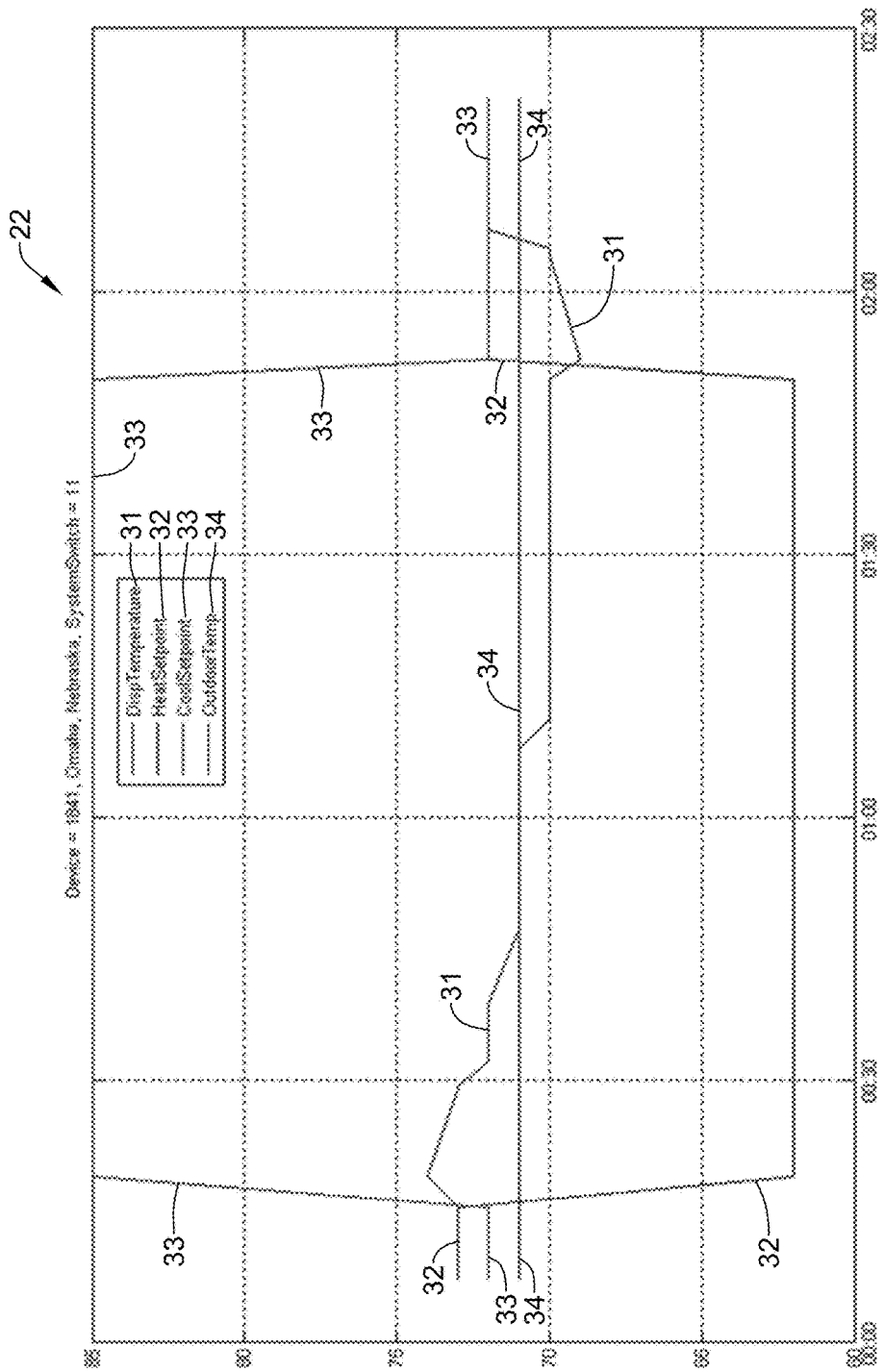
FIG. 3 is a diagram of a graph revealing the same information as the graph of FIG. 2 but with setpoint change data for a period between midnight and 2:30 AM of a day in January.

FIG. 3 is a diagram of a graph 22 revealing the same information as graph 21 but with setpoint change data for a period between midnight and 2:30 AM of a day in January.

Figure 4:
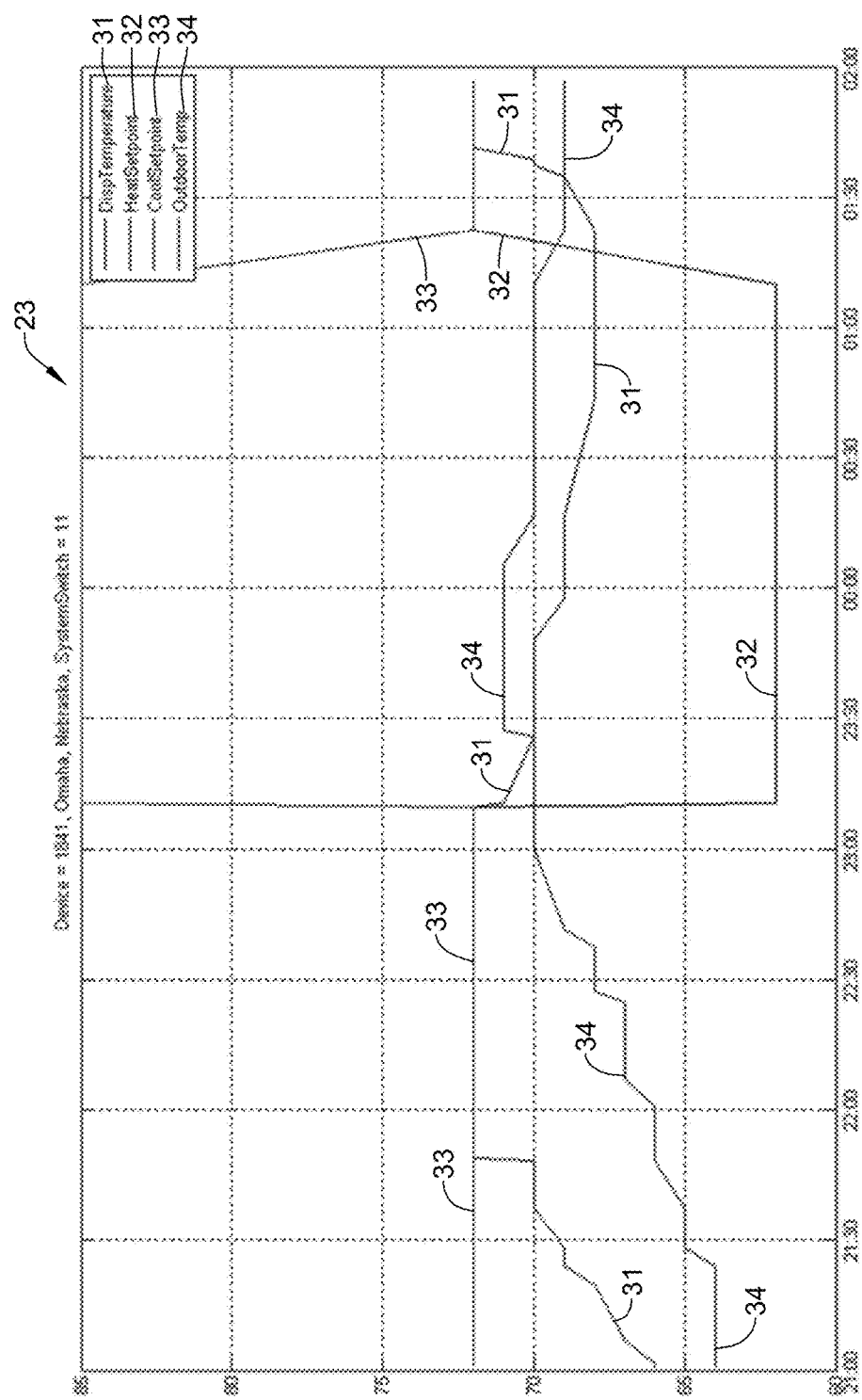
FIG. 4 is a diagram of a graph for a period between 9:00 PM and 2:00 AM of another day in January, with setpoint change data and revealing the same information as that in the graph of FIG. 2.

FIG. 4 is a diagram of a graph 23 for a period between 9:00 PM and 2:00 AM of another day in January, with setpoint change data and revealing the same information as that in graph 21 of FIG. 2.

Figure 5:
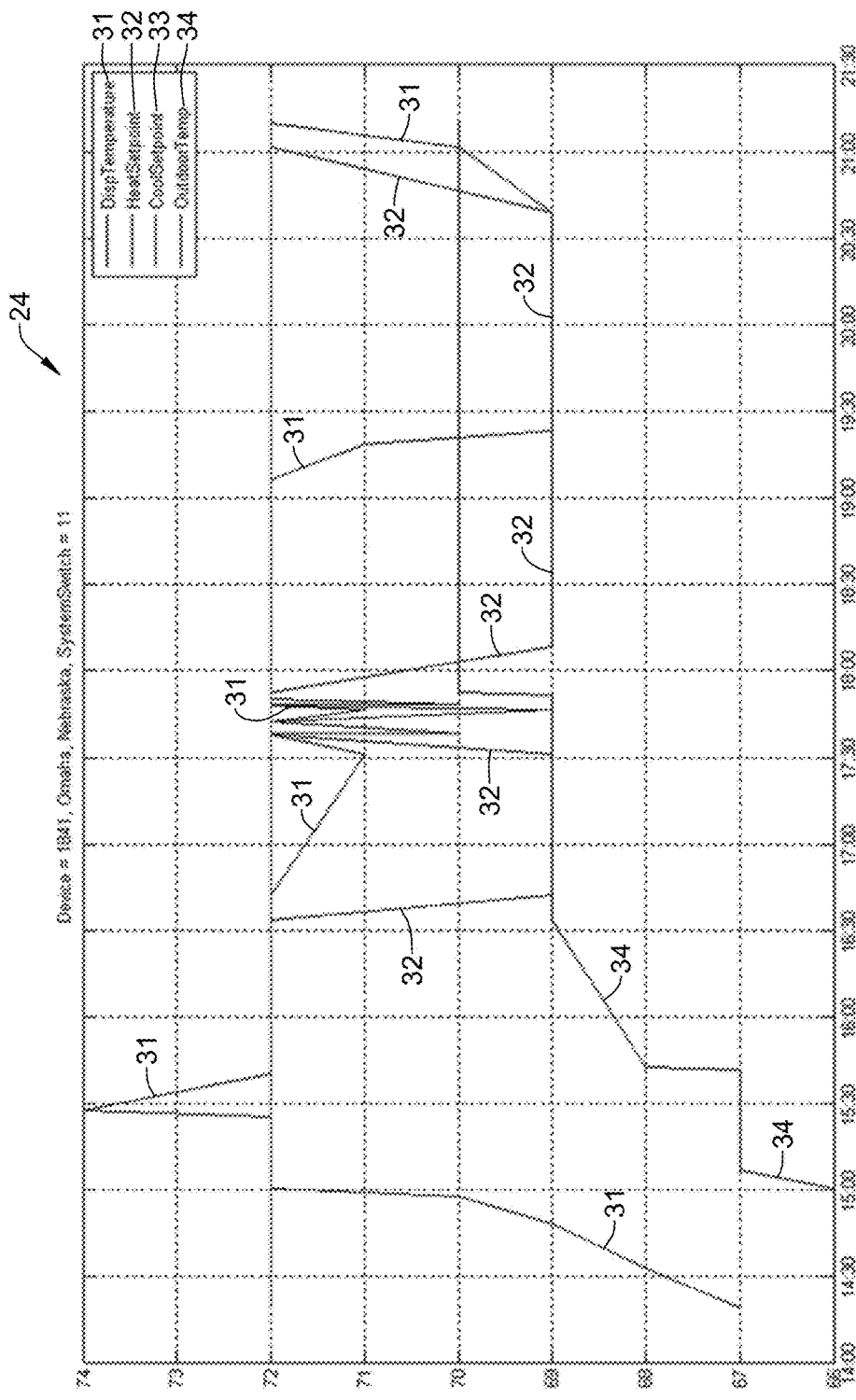
FIG. 5 is a diagram of a graph revealing setpoint change data with same information as that in the graph of FIG. 2 but for a period between 2:00 PM and 9:30 PM of another day in January.
Figure 6:
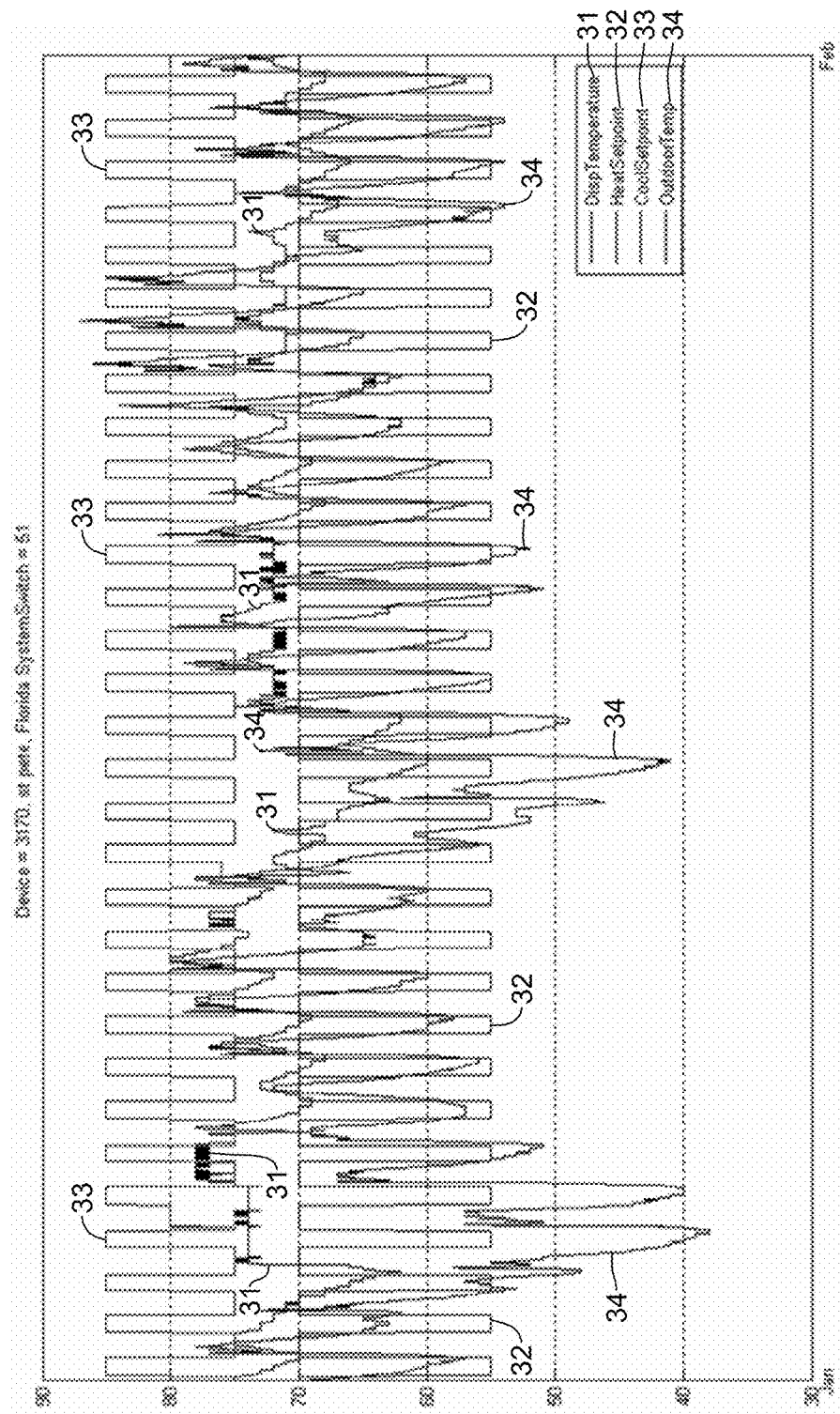
FIGS. 6, 7, 8, 9, 10 and 11 are diagrams of graphs revealing building setpoints and temperatures for buildings generally during a month of January at various locations and the graphs of FIGS. 2-11 may be regarded as exploratory.
Figure 7:
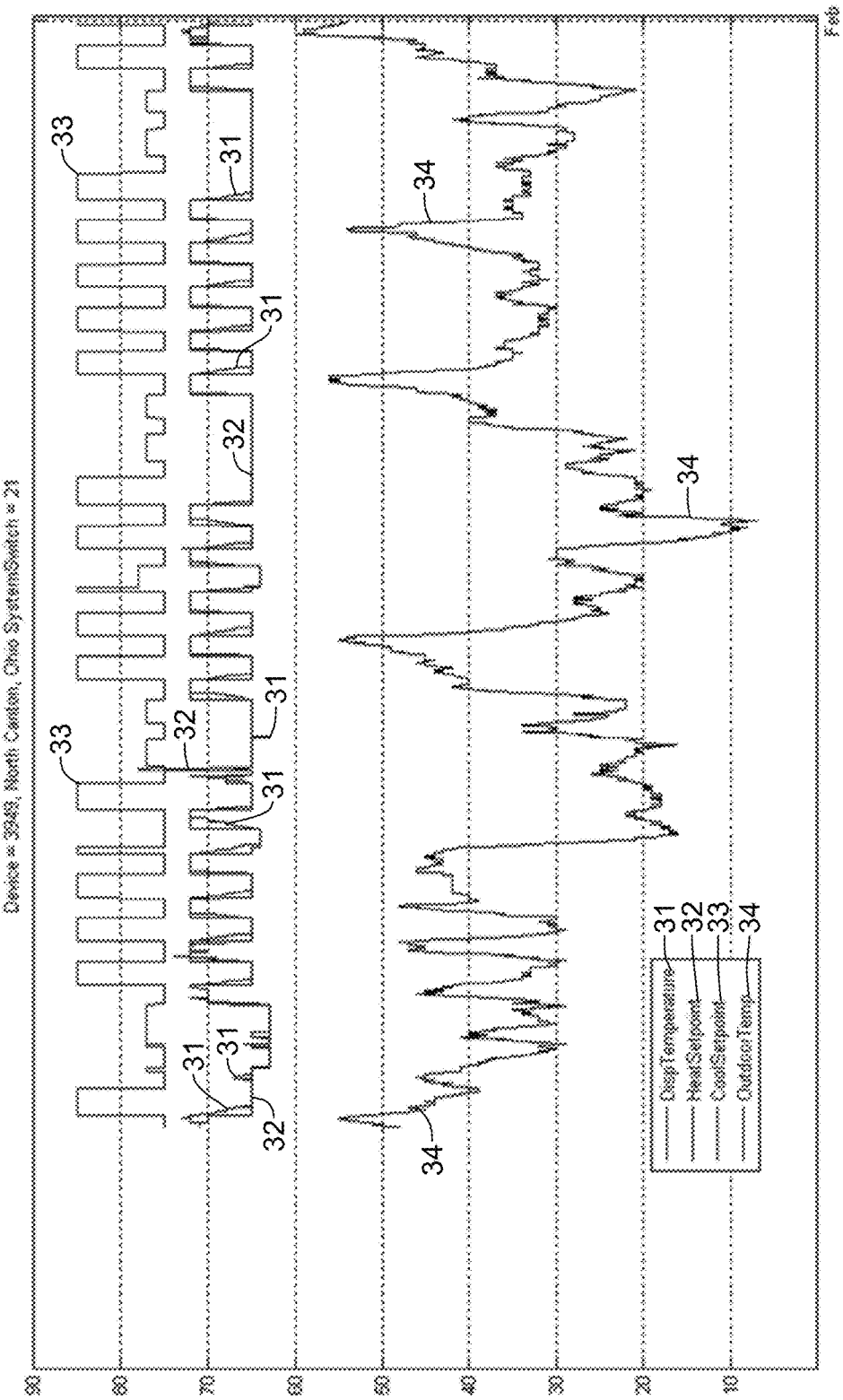
Figure 8:
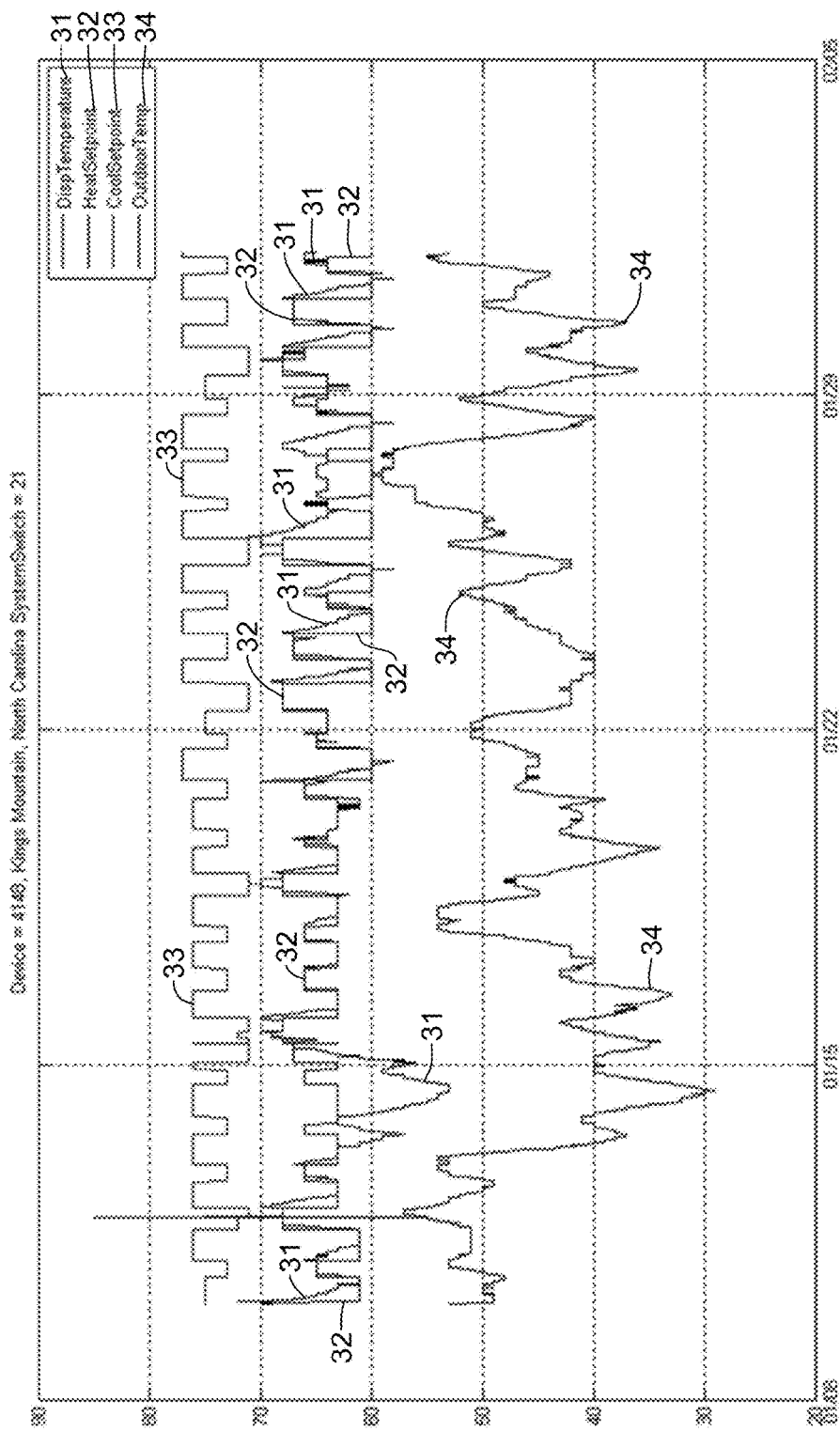
Figure 9:
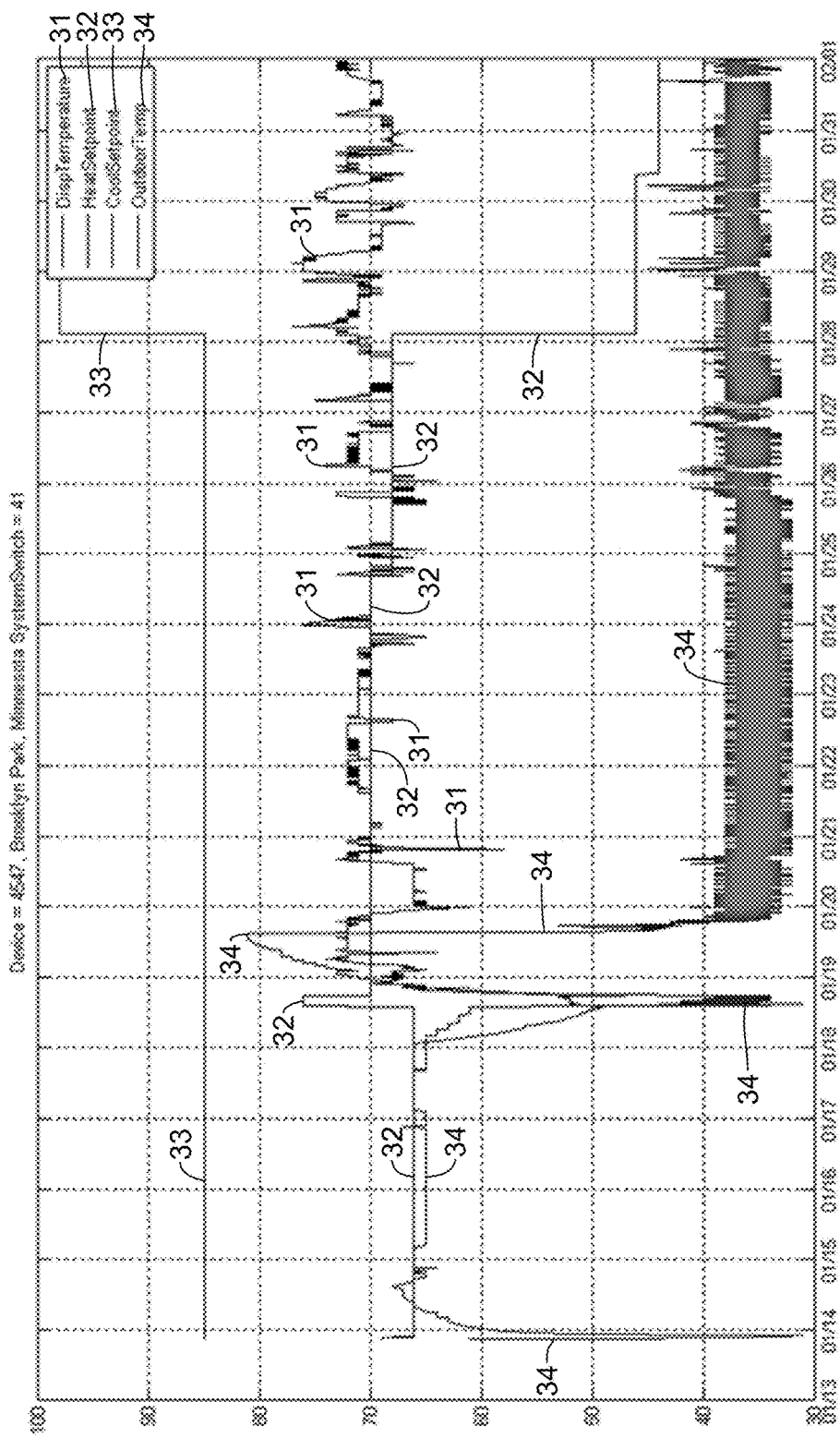
Figure 10:
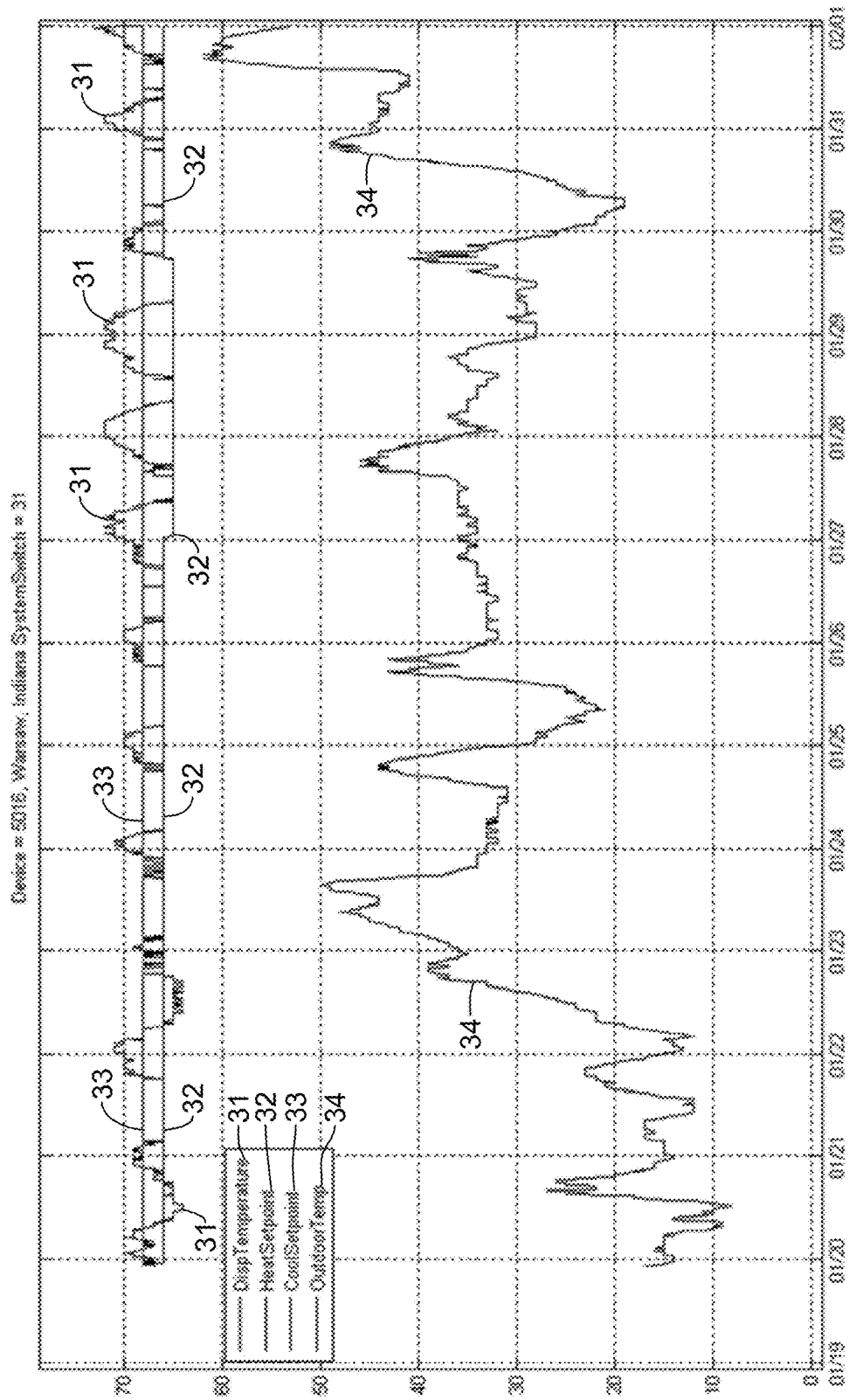
Figure 11:
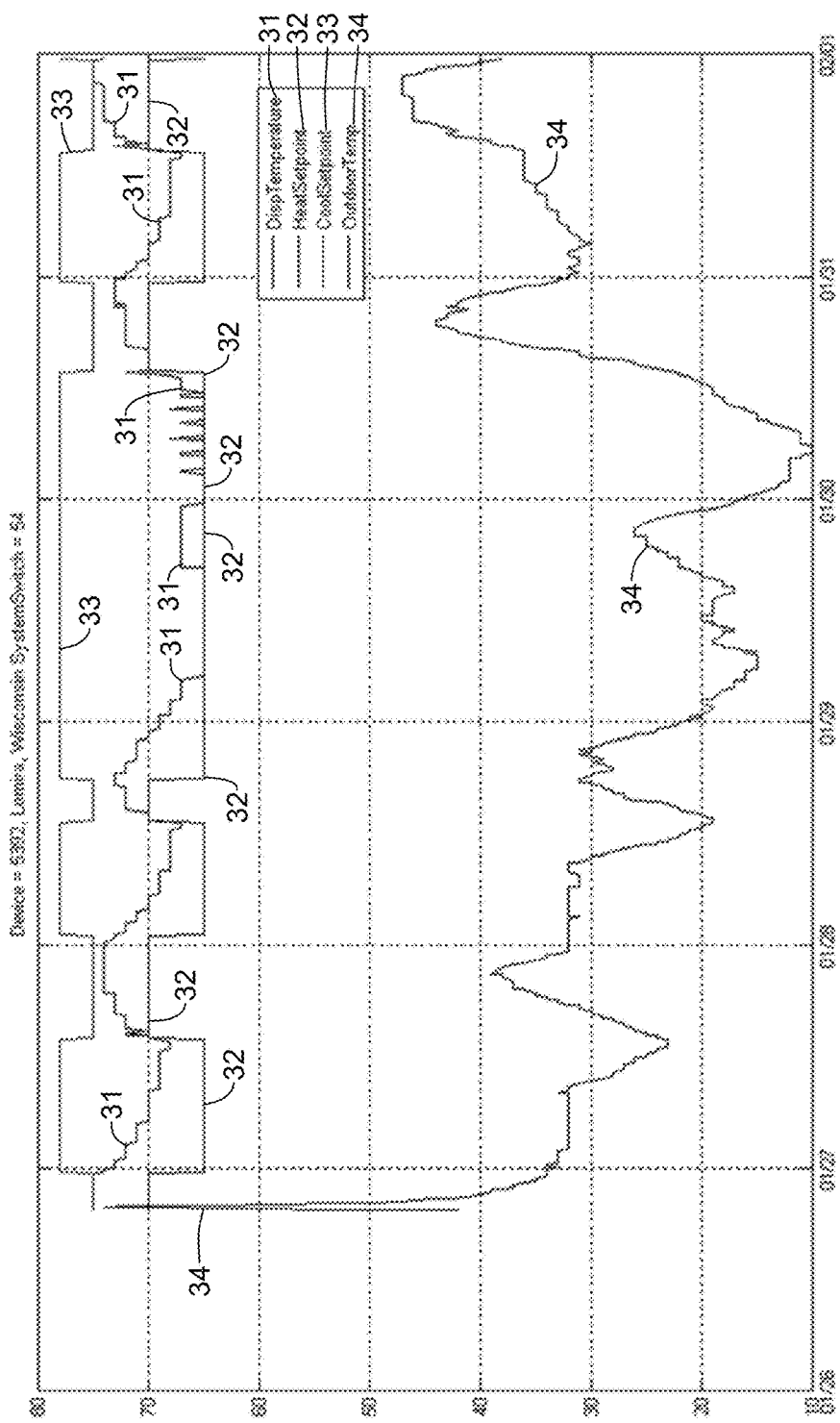

FIG. 5 is a diagram of a graph 24 revealing setpoint change data with same information as that in graph 21 of FIG. 2 but for a period between 2:00 PM and 9:30 PM of another day in January.

FIGS. 6, 7, 8, 9, 10 and 11 are diagrams of graphs 25, 26, 27, 28, 29 and 30, respectively, revealing building setpoints and temperatures for buildings generally during a month of January at various locations. The graphs reveal disp temperature 31, heat setpoint 32, cool setpoint 33 and outdoor temperature 34. Graphs 25-30 reveal information similar to that of graph 21 for Omaha, Nebr. Graphs 25, 26, 27, 28, 29 and 30 have information from locations at St. Petersburg, Fla., North Canton, Ohio, Kings Mountain, N.C., Brooklyn Park, Minn., Warsaw, Ind., and Lomira, Wis., respectively.

Figure 14:
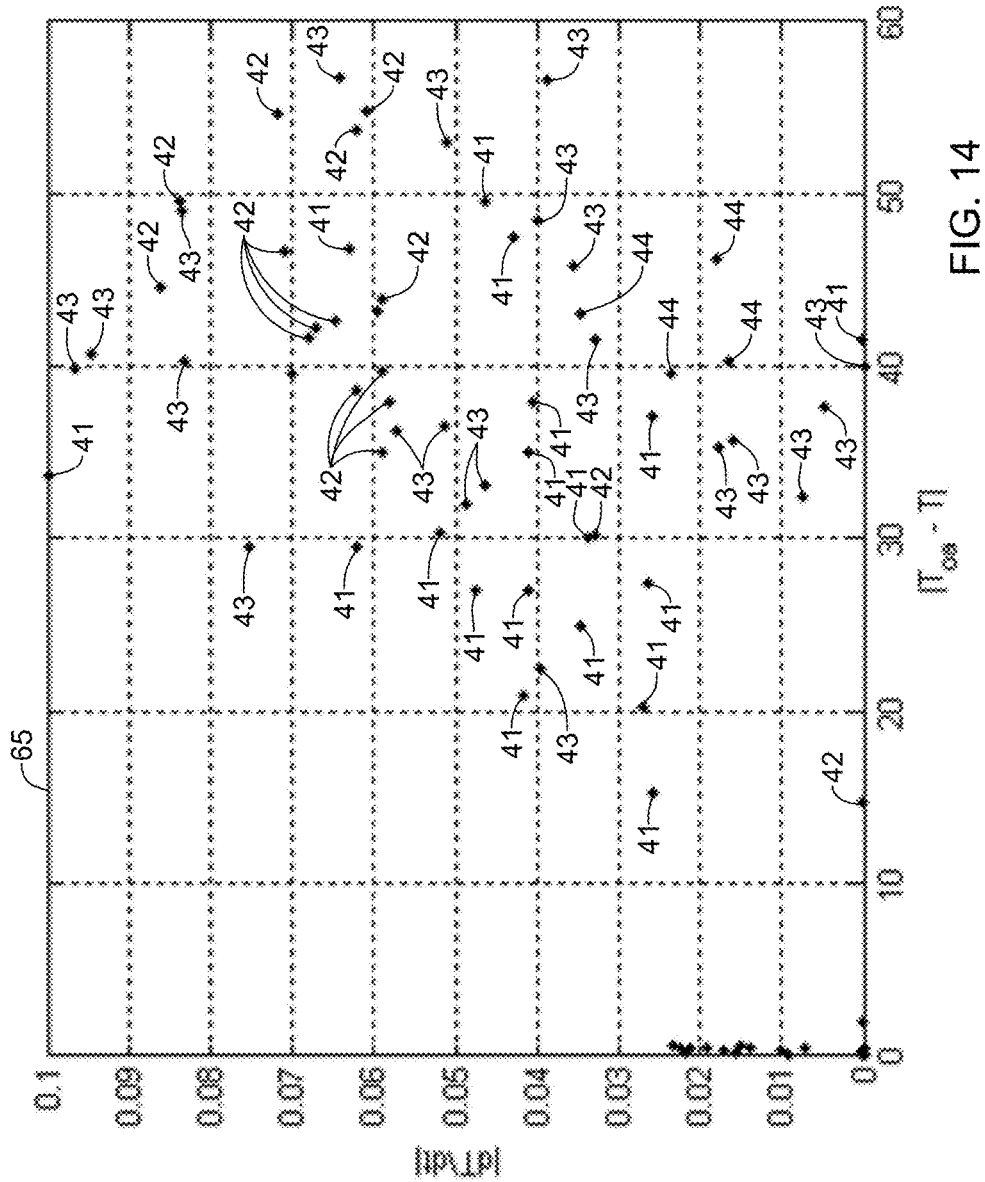
FIG. 14 is a diagram of a plot of |dT/dt| versus delta T for various conditions relating to a temperature, heat setpoint, cool setpoint and outdoor temperature.

FIG. 14 is a diagram of a plot 65 of |dT/dt| versus |Toa−T| for various conditions relating to disp temperature 41, heat setpoint 42, cool setpoint 43 and outdoor temperature 44. Plot 65 may be regarded as schematic rather than actual.

Figure 15:
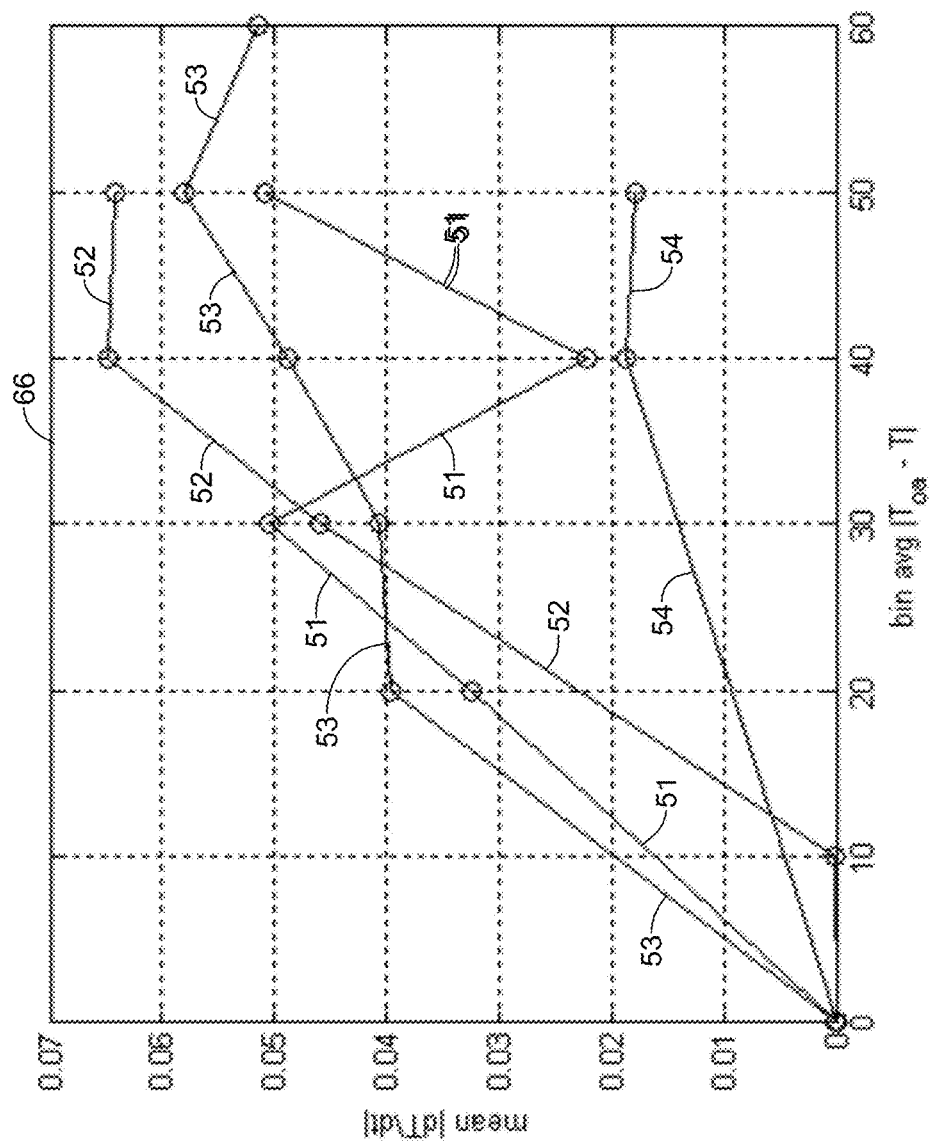
FIG. 15 is a diagram of a graph of mean |dT/dt| versus bin avg |Toa-T| of data in a plot.

FIG. 15 is a diagram of a graph 66 of mean |dT/dt| versus bin avg |Toa−T| of plot 65. Graph lines 51, 52, 53 and 54 relate to data points 41, 42, 43 and 44, respectively.

Figure 16:
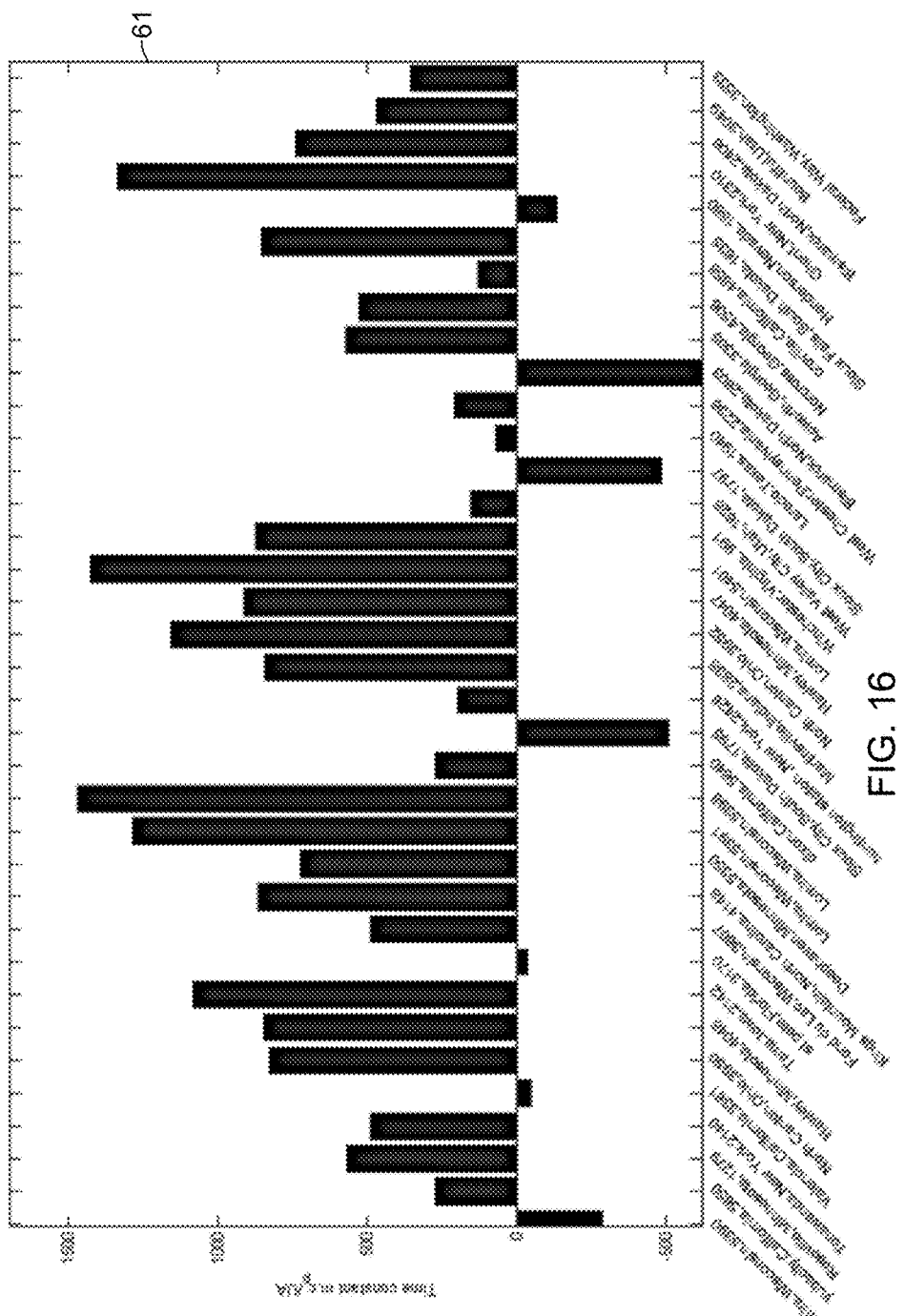
FIG. 16 is a diagram of a bar graph indicating time constants of various facilities at different geographical locations.

FIG. 16 is a diagram of a bar graph 61 indicating time constants of various facilities at different geographical locations. A scale of time constant "m·Cp/UA" may range from about −600 to about +1700 units. Locations may be from around the country. However, a location may be repeated, for instance, Lomira, Wis. A time constant may be different for each instance of a location since a facility or building for each time constant can be different.

Figure 17:
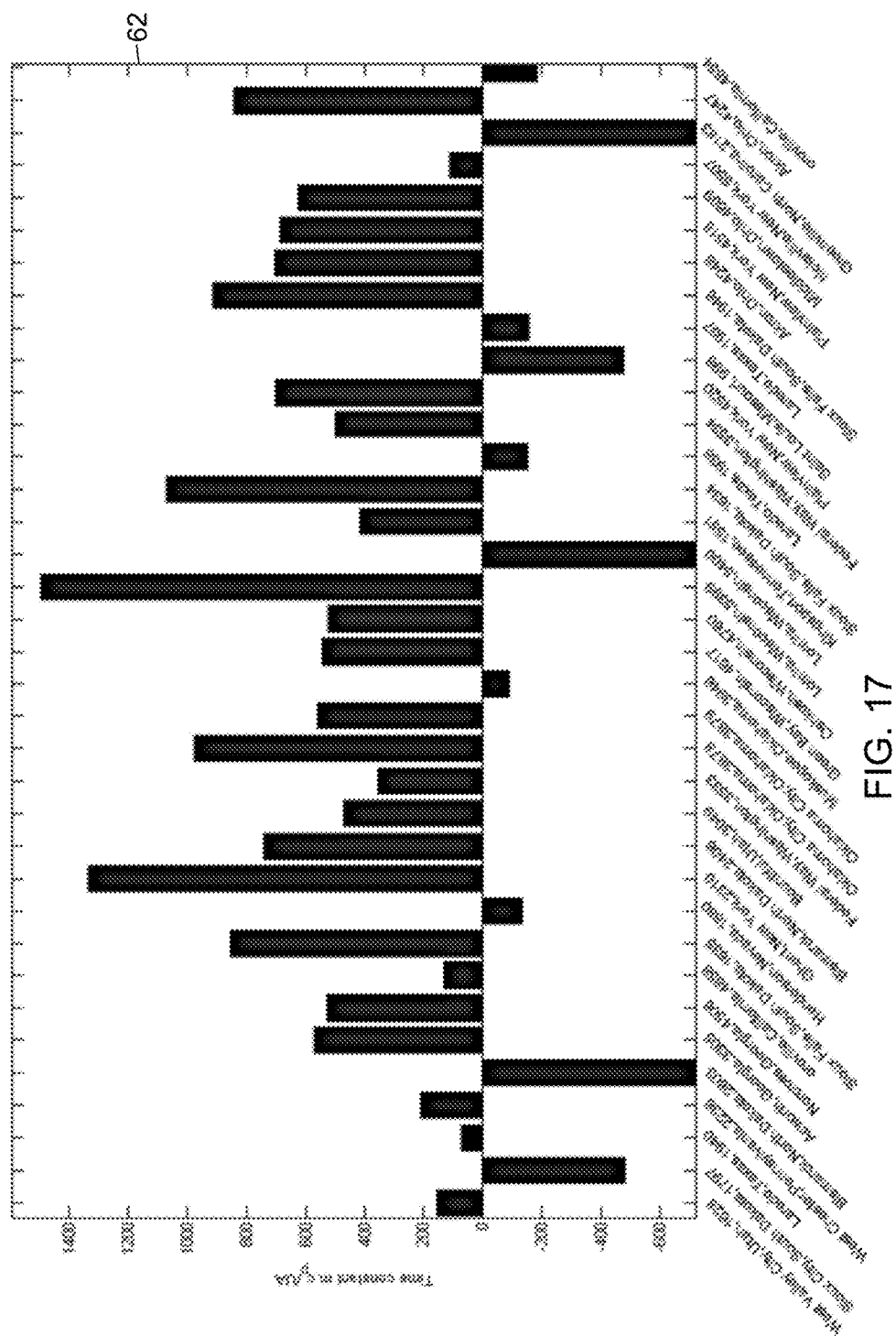
FIG. 17 is a diagram of a bar graph similar to the graph of FIG. 16 with a time constant for more instances of facilities or buildings at various locations.
Figure 18:
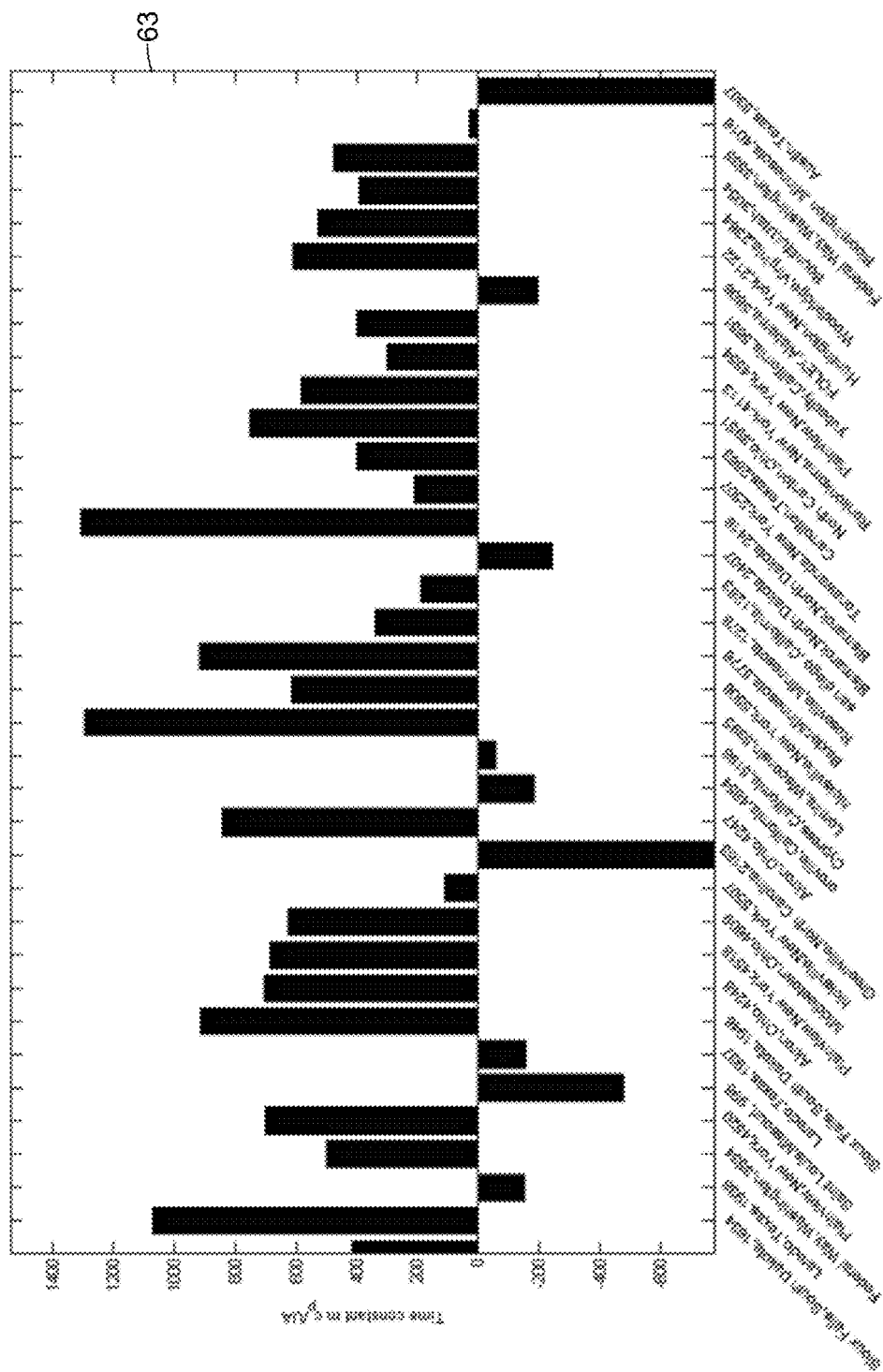
FIG. 18 is a diagram of bar graph similar to the graphs of FIGS. 16 and 17 with time constants for additional instances of facilities or buildings at various locations and the graphs may be regarded as exploratory.

FIG. 17 is a diagram of a bar graph 62 similar to graph 61 with a time constant for more instances of facilities or buildings at various locations. Some locations may be the same as those in graph 61. Likewise, FIG. 18 is a diagram of bar graph 63 similar to graphs 61 and 62 with time constants for additional instances of facilities or buildings at various locations. Some of the locations may be similar to those in graphs 61 and 62. These graphs may be regarded as exploratory.

Figure 19:
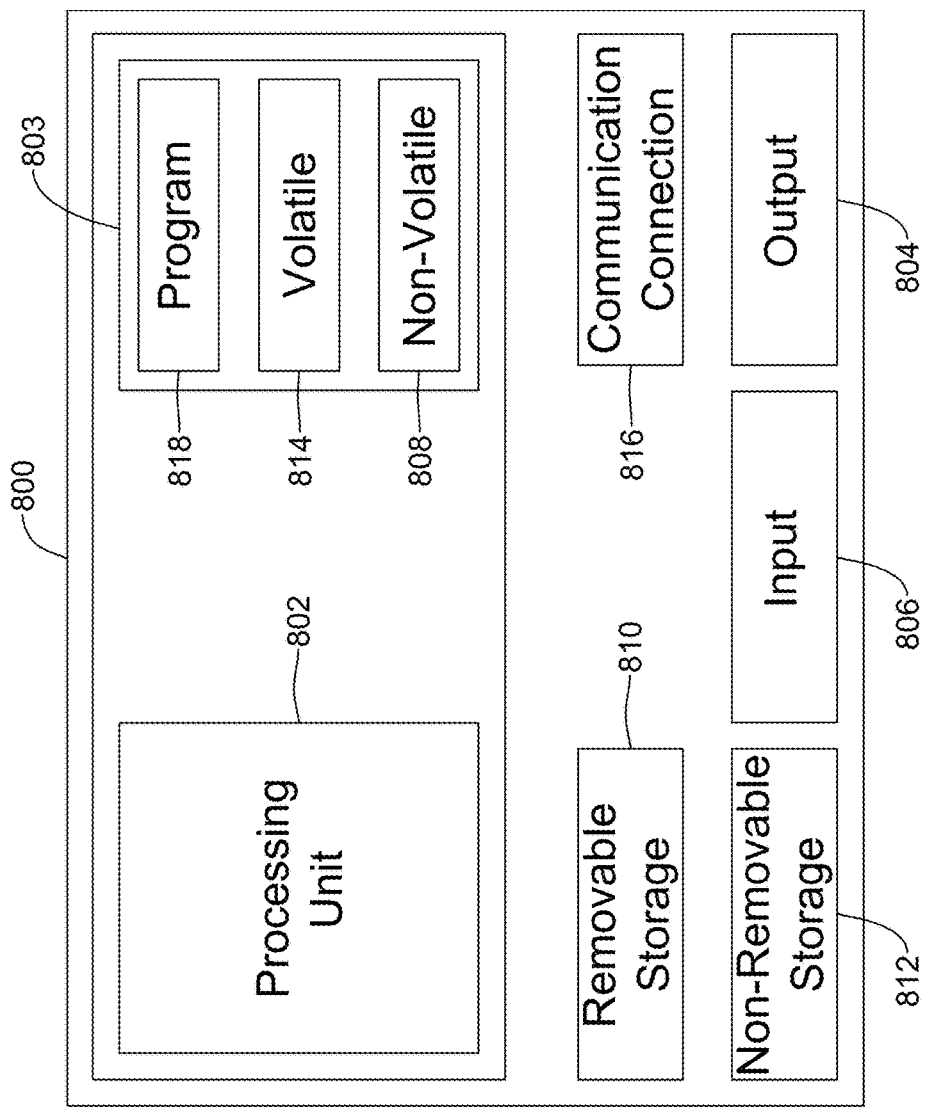
FIG. 19 is a diagram of a computer system for implementing one or more approaches and algorithms according to illustrative examples.

FIG. 19 is a diagram of a computer system 800 for implementing one or more approaches and algorithms according to illustrative examples. In one example, multiple computer systems may be utilized in a distributed network to implement multiple components in a transaction based environment. An object-oriented, service-oriented, or other architecture may be used to implement such functions and provide communications among multiple systems and components. One example computing device in the form of a computer 800 may include a processing unit 802, memory 803, removable storage 810, and non-removable storage 812.

Memory 803 may have a volatile memory 814 and a non-volatile memory 808. Computer 800 may incorporate or have access to a computing environment that has a variety of computer-readable media, such as volatile memory 814 and non-volatile memory 808, removable storage 810 and non-removable storage 812. Computer storage may incorporate random access memory (RAM), read only memory (ROM), erasable programmable read-only memory (EPROM), and electrically erasable programmable read-only memory (EEPROM), flash memory and/or other kinds of memories. Storage mechanisms may also incorporate compact disc read-only memory (CD ROM), digital versatile disks (DVD), optical disks, magnetic cassettes, magnetic tape, magnetic disks or other magnetic storage devices, or any other medium capable of storing computer-readable instructions, information and data.

Computer 800 may have access to a computing environment that includes input 806, output 804, and a communication connection 816. The computer may operate in a networked environment using a communication connection to connect to one or more remote computers, such as database servers.

Computer 800 may facilitate use cloud processing, data accession, obtaining data and sensing from various locations, data storage, and the like, for effecting the present system and approach for classifying building energy characteristics based on connected thermostat data.

A remote computer may incorporate a personal computer (PC), server, router, network PC, a peer device or other common network node, or the like. The communication connection may include a local area network (LAN), a wide area network (WAN) and/or other networks.

Computer-readable instructions stored on a computer-readable medium may be executable by the processing unit 802 of the computer 800. A hard drive, CD-ROM, and RAM may be examples of articles including a non-transitory computer-readable medium. For example, a computer program 818 may be capable of providing a generic technique to perform access control, check for data access and/or doing an operation on one of the servers in a component object model (COM) based system which may be incorporated on a CD-ROM and loaded from the CD-ROM to a hard drive. Computer-readable instructions may allow computer 800 to provide generic access controls in a COM based computer network system having multiple users and servers.

To recap, a system for classifying characteristics of buildings may incorporate a computer, and one or more thermostats situated in one or more buildings, respectively, and have a connection to the computer.

Each of the one or more thermostats may provide time series data to the computer. The time series data may incorporate indoor temperature, outdoor temperature, and temperature setpoints relative to time. A thermal response model for each of the one or more buildings may be derived from the time series data. A connection may have one or more intermediary connections. A connection may be wire, wireless, or wire and wireless.

The model may approximate thermal mass with respect to the heat loss characteristics for a building. A relationship between the thermal mass and the heat loss characteristics may define a time constant for a building.

A time constant of a building may be represented by $(mc_p/UA)=((T_{oa}-T_{in})/(dT/dt))$. $mc_p$ may represent thermal mass of the building. UA may represent heat transfer or loss from the building per degree of temperature. $T_{oa}$ may represent temperature outside of the building. $T_{in}$ may represent temperature inside of the building.

A time constant of a building may be estimated from correlating a rate of temperature change in the building with a difference between the outdoor temperature and the indoor temperature of the building.

The system may further incorporate classifying buildings according to time constants of the respective buildings.

The time constant of a building may be refined with additional data. The additional data may incorporate one or more items from a group consisting of heating source specifications, cooling source specifications, building insulation information, building size, and surface areas relevant to the building. Insulation information may include a nature and properties of a building structure, R value of insulation, environmental and ambient conditions about the building, and so on.

The one or more thermostats may be connected to the computer via a communications network.

The communications network may incorporate access to one or more items selected from a group consisting of processing, memory, application servers, sensors, databases, specifications for the one or more buildings, specifications of thermostats, receipt and storage of time-series data from the one or more thermostats, and derivation of the thermal response model for each of the one or more buildings from the time-series data.

The one or more thermostats may be connectable or connected to a network. The one or more thermostats may be viewable and operable by a smart device via the network. The one or more thermostats may be connectable to the network via a wire or wireless medium or media such as WiFi, or the one or more thermostats may be controllable by the smart device via a wire or wireless medium or media such as WiFi.

An approach for classifying energy characteristics of buildings may incorporate obtaining data from one or more thermostats in one or more buildings, creating a thermal response model of a building from the data, extracting parameters from the thermal response model for deriving thermal capacity and energy efficiency of the building, and classifying the one or more buildings as groups with respect to the parameters and weather conditions external to the one or more buildings.

The one or more thermostats may be connectable or connected to a communications network.

The approach may further incorporate providing a computer connectable or connected to the communications network. The computer may provide processing to obtain the data from the one or more thermostats, create the thermal response model of a building from the data, extract parameters from the thermal response model, or classify the one or more buildings with respect to the parameters.

The approach may further incorporate providing a computer connectable or connected to the communications network. The computer may be operated to have the data from the one or more thermostats to be put in a storage connected to the communications network, to create a thermal response model of a building by a processor connected to the communications network, to extract parameters from the thermal response model by a processor connected to the communications network, or to classify the one or more buildings with respect to the parameters by a processor connected to the communications network.

The approach may further incorporate deriving a time constant for each of the one or more buildings from a relationship of insulation information and thermal mass of each of the one or more buildings, respectively.

A mechanism for determining energy characteristics may incorporate one or more thermostats situated inside one or more buildings, respectively, and a computer connected to the one or more thermostats. The one or more thermostats may provide time-series data to the computer. The time-series data may incorporate one or more items selected from a group consisting of indoor temperatures, indoor humidity, temperature setpoints, outdoor temperatures, outdoor humidity, heating mode, and cooling mode.

The time series data may be recorded asynchronously.

A thermal response model of each of the one or more buildings may be developed from the time series data. One or more parameters related to thermal capacity and energy efficiency, determined together for each of the one or more buildings, may be extracted from the respective thermal response model.

The one or more parameters may be selected from a group consisting of building insulation information, building size, surface areas, information about a heating source and information about a cooling source.

A rate of indoor temperature change inside a building and a difference between indoor temperature and outdoor temperature of each of the one or more buildings may indicate insulation information respectively for each of the one or more buildings. A thermal mass may be obtained for each of the one or more buildings. A time constant may be determined for each of the one or more buildings from an insulation information and thermal mass of each of the one or more buildings.

The time constant may be used for one or more items of a group consisting of classifying buildings, identifying patterns of buildings resembling particular geographical locations, identifying patterns of buildings indicating particular types of buildings, detecting patterns resembling anomalous energy performance of a building, and identifying patterns that indicate degradation of energy performance of a building over time.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A demand response system for classifying characteristics of buildings and controlling thermostats, the system comprising:
    a computer; and
    one or more thermostats situated in one or more buildings, respectively, and having a connection to the computer; and
    wherein:
        each of the one or more thermostats provides time series data to the computer;
        the time series data comprise indoor temperature, outdoor temperature, and temperature setpoints relative to time;
        a thermal response model for each of the one or more buildings is derived from the time series data;
        a connection includes one or more intermediary connections; and
        the one or more intermediary connections are wired, wireless, or wired and wireless,
        a relationship between thermal mass and heat loss characteristics of a building defines a time constant for a building and the time constant of a building is represented by $(mc_p/UA)=((T_{oa}-T_{in})/(dT/dt))$, wherein:
            $mc_p$ represents thermal mass of the building;
            $UA$ represents heat transfer or loss from the building per degree of temperature;
            $T_{oa}$ represents temperature outside of the building;
            $T_{in}$ represents temperature inside of the building; and
            $(dT/dt)$ represents a rate of change of temperature inside of the building; and
        a demand response control signal is provided from the computer to at least one thermostat of the one or more thermostats to adjust the operation of the at least one thermostat, the demand response control signal is customized to adjust operation of the at least one thermostat based on the relationship between the thermal mass and heat loss characteristic of a building of the one or more buildings in which the at least one thermostat is situated.

2. The system of claim 1, wherein the thermal response model approximates thermal mass with respect to the heat loss characteristics for a building.

3. The system of claim 1, wherein the time constant of a building is estimated from correlating a rate of temperature change in the building with a difference between the outdoor temperature and the indoor temperature of the building.

4. The system of claim 3, further comprising classifying buildings according to time constants of the respective buildings.

5. The system of claim 3, wherein:
    the time constant of a building is refined with additional data; and
    the additional data comprises one or more items from a group consisting of heating source specifications, cooling source specifications, building insulation information, building size, and surface areas relevant to the building.

6. The system of claim 1, wherein the one or more thermostats are connected to the computer via a communications network.

7. The system of claim 6, wherein the communications network comprises access to one or more items selected from a group consisting of processing, memory, application servers, sensors, databases, specifications for the one or more buildings, specifications of thermostats, receipt and storage of time-series data from the one or more thermostats, and derivation of the thermal response model for each of the one or more buildings from the time-series data.

8. The system of claim 1, wherein:
    the one or more thermostats are connectable or connected to a network;
    the one or more thermostats are viewable and operable by a smart device via the network; and
    the one or more thermostats are connectable to the network via a wire or wireless medium or media, or the one or more thermostats are controllable by the smart device via a wire or wireless medium or media.

9. A demand response method for classifying buildings and controlling thermostats, the method comprising:
    obtaining time series data from one or more thermostats in one or more buildings;
    creating a thermal response model of a building from the time series data;
    extracting parameters from the thermal response model;
    classifying the one or more buildings as groups with respect to the parameters and weather conditions external to the one or more buildings,
    deriving a time constant for each of the one or more buildings from a relationship of insulation information and thermal mass of each of the one or more buildings, respectively;
    sending a demand response control signal to at least one thermostat of the one or more thermostats to adjust operation of the at least one thermostat, the demand response control signal is customized to adjust operation of the at least one thermostat based on the derived time constant of a building of the one or more buildings in which the at least one thermostat is situated; and
    wherein:
        the parameters include one or more of specific heat capacity, mass heat transfer coefficient, and internal heating/cooling source information;
        the time series data includes one or more of indoor temperature relative to time, outdoor temperature relative to time, and temperature setpoints relative to time; and
        the time constant of a building is represented by $(mc_p/UA)=((T_{oa}-T_{in})/(dT/dt))$, wherein:

$mc_p$ represents thermal mass of the building;

UA represents heat transfer or loss from the building per degree of temperature;

$T_{oa}$ represents temperature outside of the building;

$T_{in}$ represents temperature inside of the building; and (dT/dt) represents a rate of change of temperature inside of the building.

10. The method of claim 9, wherein the one or more thermostats are connectable or connected to a communications network.

11. The method of claim 10, further comprising:
providing a computer connectable or connected to the communications network; and
wherein the computer provides processing to obtain the time series data from the one or more thermostats, create the thermal response model of a building from the time series data, extract parameters from the thermal response model, or classify the one or more buildings with respect to the parameters.

12. The method of claim 10, further:
comprising providing a computer connectable or connected to the communications network; and
wherein the computer is operated to have the time series data from the one or more thermostats to be put in a storage connected to the communications network, to create a thermal response model of a building by a processor connected to the communications network, to extract parameters from the thermal response model by a processor connected to the communications network, or to classify the one or more buildings with respect to the parameters by a processor connected to the communications network.

13. A demand response mechanism for determining energy characteristics and controlling thermostats, the mechanism comprising:
one or more thermostats situated inside one or more buildings, respectively; and
a computer connected to the one or more thermostats; and
wherein:
the one or more thermostats provide time-series data to the computer;
the time-series data comprise one or more items selected from a group consisting of indoor temperatures, indoor humidity, temperature setpoints, outdoor temperatures, outdoor humidity, heating mode, and cooling mode;
a time constant is determined for at least one of the one or more buildings, the time constant of a building is represented by $(mc_p/UA)=((T_{oa}-T_{in})/(dT/dt))$, wherein:
$mc_p$ represents thermal mass of the building;

UA represents heat transfer or loss from the building per degree of temperature;

$T_{oa}$ represents temperature outside of the building;

$T_{in}$ represents temperature inside of the building; and (dT/dt) represents a rate of change of temperature inside of the building; and a demand response control signal is provided from the computer to at least one thermostat of the one or more thermostats to adjust operation of the at least one thermostat, the demand response control signal is customized to adjust operation of the at least one thermostat based on the time constant of a building of the one or more buildings in which the at least one thermostat is situated.

14. The mechanism of claim 13, wherein the time series data is recorded asynchronously.

15. The mechanism of claim 13, wherein:
a thermal response model of each of the one or more buildings is developed from the time series data; and
one or more parameters related to thermal capacity and energy efficiency, determined together for each of the one or more buildings, are extracted from the respective thermal response model.

16. The mechanism of claim 15, wherein the one or more parameters are selected from a group consisting of building insulation information, building size, surface areas, information about a heating source and information about a cooling source.

17. The mechanism of claim 13, wherein:
the rate of temperature change inside a building and a difference between indoor temperature and outdoor temperature of each of the one or more buildings indicate insulation information respectively for each of the one or more buildings;
a thermal mass is obtained for each of the one or more buildings; and
the time constant is determined for each of the one or more buildings from the insulation information and the thermal mass of each of the one or more buildings.

18. The mechanism of claim 13, wherein the time constant is used for one or more items of a group consisting of classifying buildings, identifying patterns of buildings resembling particular geographical locations, identifying patterns of buildings indicating particular types of buildings, detecting patterns resembling anomalous energy performance of a building, and identifying patterns that indicate degradation of energy performance of a building over time.

* * * * *